United States Patent
Oike et al.

(10) Patent No.: US 10,813,261 B2
(45) Date of Patent: Oct. 20, 2020

(54) MOUNTING DEVICE, SETTING DEVICE, MOUNTING SYSTEM, MOUNTING METHOD, AND SETTING METHOD

(71) Applicant: FUJI CORPORATION, Chiryu (JP)

(72) Inventors: Hiroshi Oike, Chiryu (JP); Shuichiro Kito, Toyota (JP); Kenji Sugiyama, Anjo (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 16/471,333

(22) PCT Filed: Dec. 26, 2016

(86) PCT No.: PCT/JP2016/088647
§ 371 (c)(1),
(2) Date: Jun. 19, 2019

(87) PCT Pub. No.: WO2018/122903
PCT Pub. Date: Jul. 5, 2018

(65) Prior Publication Data
US 2020/0093042 A1     Mar. 19, 2020

(51) Int. Cl.
*H05K 13/08* (2006.01)
*G05B 19/4155* (2006.01)
*H05K 13/04* (2006.01)

(52) U.S. Cl.
CPC ..... *H05K 13/0812* (2018.08); *G05B 19/4155* (2013.01); *H05K 13/0882* (2018.08);
(Continued)

(58) Field of Classification Search
CPC ........... H05K 13/0812; H05K 13/0882; H05K 13/0409; H05K 13/041; G05B 19/4155; G05B 2219/50153
(Continued)

(56) References Cited

U.S. PATENT DOCUMENTS

| 2004/0141213 A1* | 7/2004 | Kleiman | G01J 3/2823 358/474 |
| 2010/0177363 A1* | 7/2010 | Zhou | G06K 7/14 358/474 |

(Continued)

FOREIGN PATENT DOCUMENTS

| CN | 102821591 A | 12/2012 |
| JP | 2016-96174 A | 5/2016 |

OTHER PUBLICATIONS

International Search Report dated Mar. 14, 2017 in PCT/JP2016/088647 filed Dec. 26, 2016.

*Primary Examiner* — Allen H Nguyen
(74) *Attorney, Agent, or Firm* — Oblon, McClelland, Maier & Neustadt, L.L.P.

(57) ABSTRACT

A mounting device provided with: a collecting section configured to move a component for which imaging conditions are defined as a range including multiple values to an arrangement position in a state with multiple of the components collected; an imaging section configured to image the multiple components held by the collecting section; and a control section configured to, when the collecting section is holding the multiple components that include imaging conditions with ranges that are not the same, cause the imaging section to image the multiple components using imaging conditions with a shared value among the ranges defined for the multiple components held by the collecting section.

11 Claims, 6 Drawing Sheets

(52) U.S. Cl.
CPC .. *G05B 2219/50153* (2013.01); *H05K 13/041* (2018.08); *H05K 13/0409* (2018.08)

(58) Field of Classification Search
USPC .......................................................... 358/474
See application file for complete search history.

(56) References Cited

U.S. PATENT DOCUMENTS

| | | | |
|---|---|---|---|
| 2010/0229377 A1* | 9/2010 | Jindo | H05K 13/0812 29/709 |
| 2010/0296137 A1* | 11/2010 | Zahnert | H04N 1/107 358/488 |
| 2010/0305756 A1* | 12/2010 | Hoshikawa | H05K 13/0812 700/259 |
| 2012/0314265 A1 | 12/2012 | Aoshima | |
| 2017/0064883 A1* | 3/2017 | Kawai | H05K 13/041 |
| 2019/0239752 A1* | 8/2019 | Dumitrescu | G01J 3/2823 |

\* cited by examiner

FIG. 6

| Arrangement order | Component ID | Component type | Exposure time | Lighting pattern | Lighting intensity | Usable nozzle |
|---|---|---|---|---|---|---|
| 1 | Component P1 | General purpose | A~C | First, second, third | a~c | #1 |
| 2 | Component P1 | General purpose | A~C | First, second, third | a~c | #1 |
| 3 | Component P1 | General purpose | A~C | First, second, third | a~c | #1 |
| 4 | Component P1 | General purpose | A~C | First, second, third | a~c | #1 |
| 5 | Component P1 | General purpose | A~C | First, second, third | a~c | #1 |
| 6 | Component P2 | General purpose | B~D | First, second | a~b | #1 |
| 7 | Component P2 | General purpose | B~D | First, second | a~b | #1 |
| 8 | Component Pc | Special | B | First | b | #1 |
| ⋮ | ⋮ | ⋮ | ⋮ | ⋮ | ⋮ | ⋮ |

| Arrangement order | Component ID | Component type | Exposure time | Lighting pattern | Lighting intensity | Usable nozzle |
|---|---|---|---|---|---|---|
| 1 | Component P1 | General purpose | B | First | b | #1 |
| 2 | Component P1 | General purpose | B | First | b | #1 |
| 3 | Component P1 | General purpose | B | First | b | #1 |
| 4 | Component P1 | General purpose | B | First | b | #1 |
| 5 | Component P1 | General purpose | B | First | b | #1 |
| 6 | Component P2 | General purpose | B | First | b | #1 |
| 7 | Component P2 | General purpose | B | First | b | #1 |
| 8 | Component Pc | Special | B | First | b | #1 |
| ⋮ | ⋮ | ⋮ | ⋮ | ⋮ | ⋮ | ⋮ |

MOUNTING DEVICE, SETTING DEVICE, MOUNTING SYSTEM, MOUNTING METHOD, AND SETTING METHOD

TECHNICAL FIELD

The present disclosure relates to a mounting device, a setting device, a mounting system, a mounting method, and a setting method.

BACKGROUND ART

Conventionally, for example, it has been proposed that a mounting device captures an image of a mounting object (component) and first to third reference marks on a component mounting head together to determine the relative positions of the component and the first to third reference marks, and takes account of this information in the movement control to the mounting position of the component (for example, refer to patent literature 1). In this device, the first to third reference marks are provided corresponding to multiple lighting conditions having different lighting directions, so that the position of the mounting object can be accurately recognized. In addition, when multiple components to be imaged simultaneously span multiple classification categories, the mounting device performs imaging multiple times using multiple lighting conditions corresponding to the classification categories.

CITATION LIST

Patent Literature

Patent literature 1: JP-A-2016-96174

BRIEF SUMMARY

Technical Problem

However, in the device disclosed in the above patent literature 1, when multiple components span multiple classification categories, imaging is performed multiple times using multiple lighting conditions, so imaging takes a long time.

The present disclosure takes account of such circumstances and an object thereof is to provide a mounting device, a setting device, a mounting system, a mounting method, and a setting method that can further shorten the production time.

Solution to Problem

The present disclosure employs the following means to achieve the above object.

The mounting device disclosed in this specification is provided with: a collecting section configured to move a component for which imaging conditions are defined as a range including multiple values to an arrangement position in a state with multiple of the components collected; an imaging section configured to image the multiple components held by the collecting section; and a control section configured to, when the collecting section is holding the multiple components that include imaging conditions with ranges that are not the same, cause the imaging section to image the multiple components using imaging conditions with a shared value among the ranges defined for the multiple components held by the collecting section.

In this mounting device, imaging conditions are defined with respect to the components as a range including multiple values. In this device, when the collecting section holds multiple components including imaging conditions with a non-identical range, the imaging section captures multiple components under imaging conditions with a common value among the ranges defined for the multiple components held by the collecting section. In this manner, with this device, since the imaging conditions are defined in a range, compared with a device in which the imaging conditions for the components are defined as an optimum value, the possibility that imaging conditions share the same value when holding components for which the imaging conditions do not have the same range increases, and the components can be imaged as few times as possible. Therefore, with this device, the production time can be shortened. Here, for example, the ranges of the imaging conditions may be empirically determined so that the components can be recognized within an acceptable range in an image of the components.

BRIEF DESCRIPTION OF DRAWINGS

FIG. 3 illustrates an example of component database 34 stored in memory section 33.
FIG. 6 illustrates setting of imaging conditions.

DESCRIPTION OF EMBODIMENTS

Figure 1:
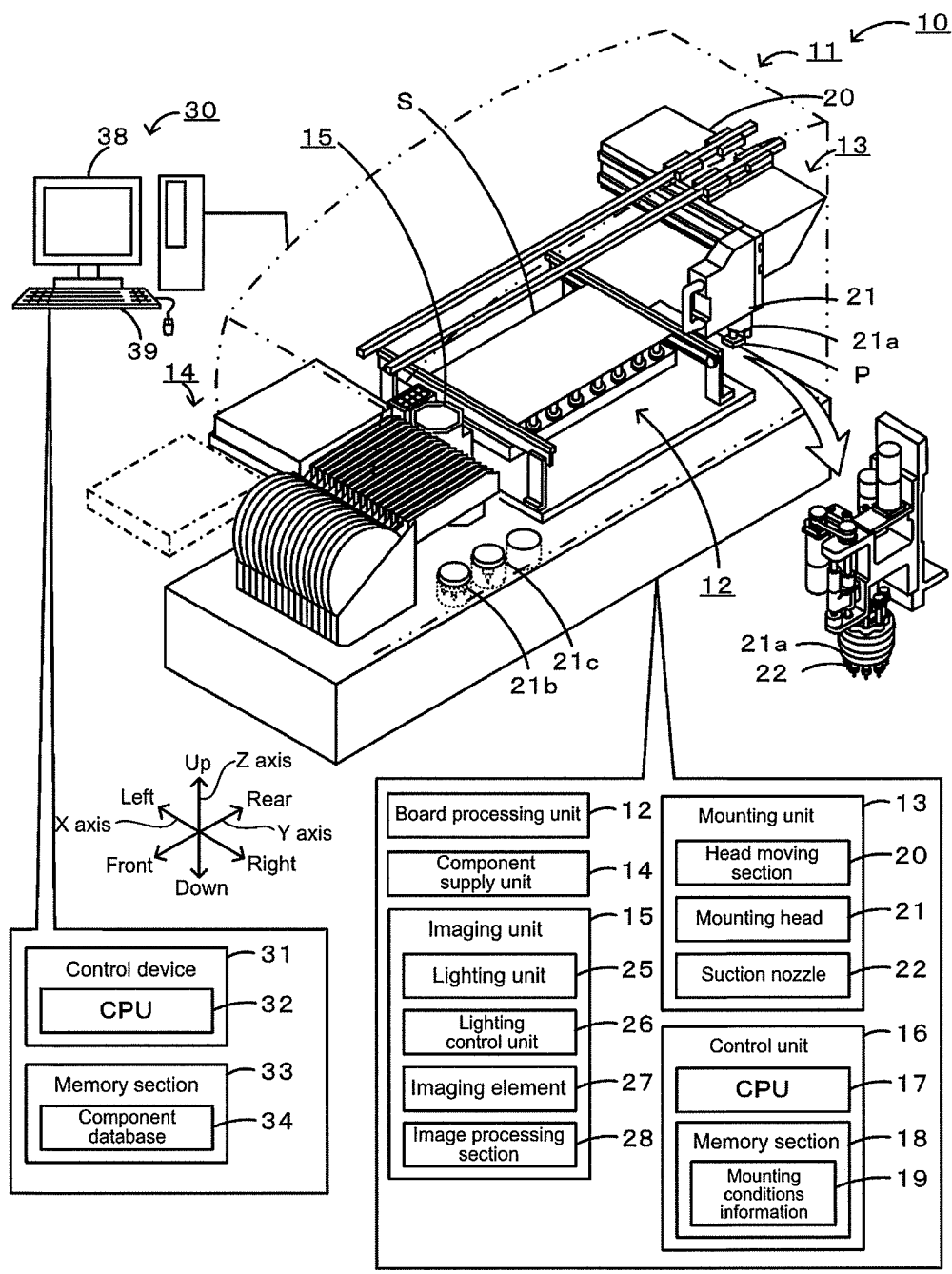
FIG. 1 is a schematic view showing an example of mounting system 10.
Figure 2:
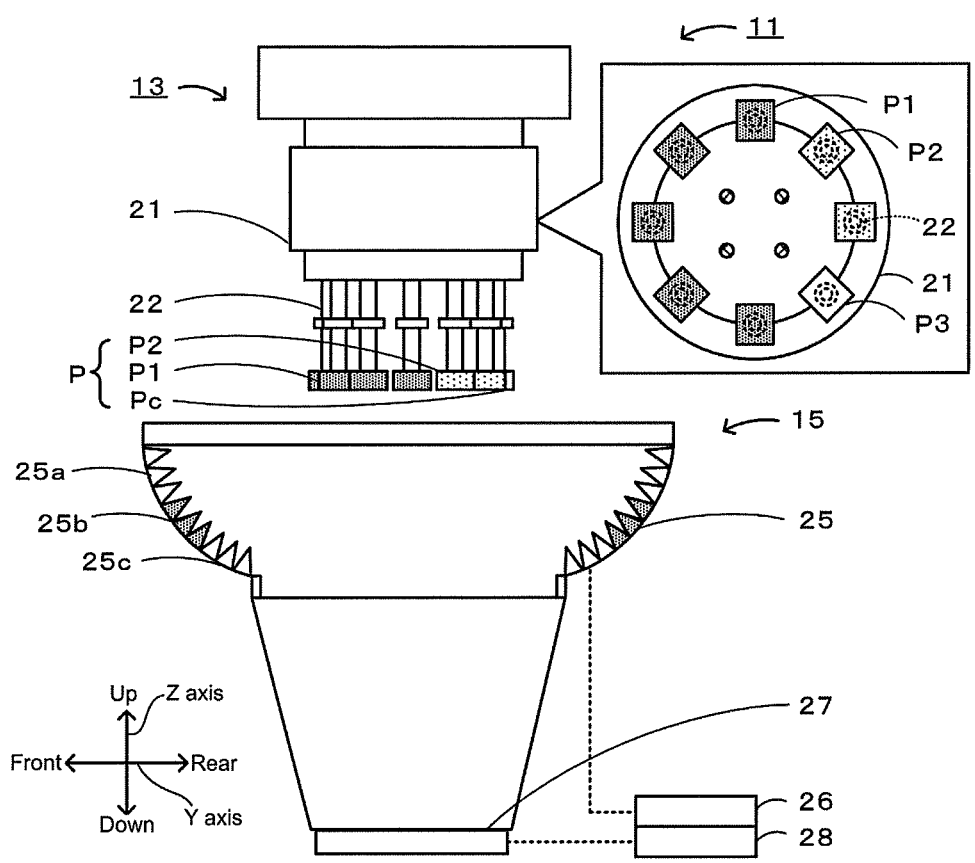
FIG. 2 shows mounting unit 13 and imaging unit 15.
Figure 3:
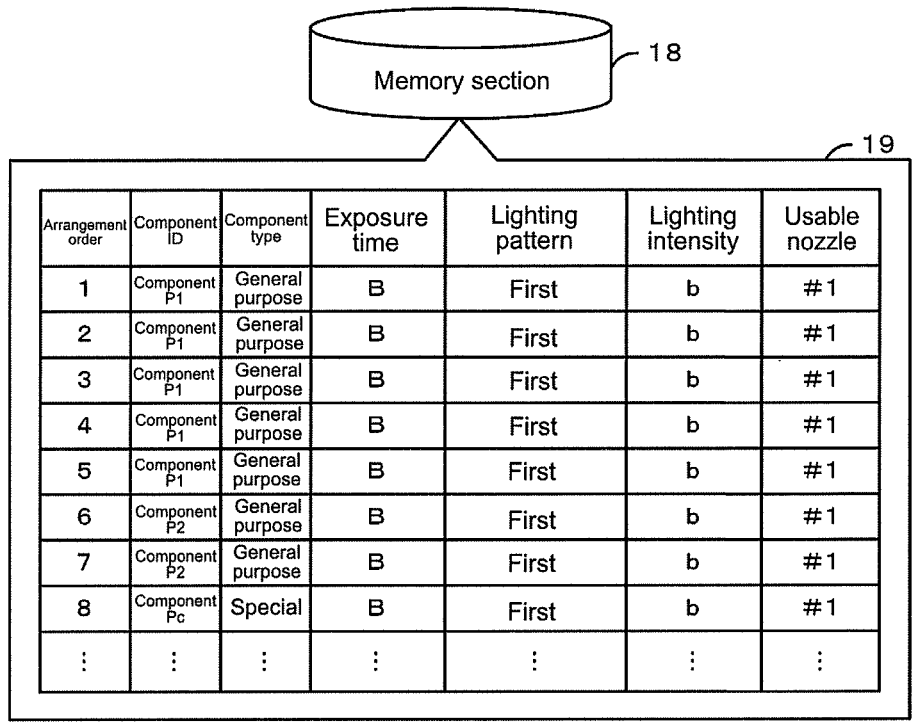
FIG. 3 shows an example of mounting conditions information 19 stored in the memory section 18.
Figure 4:
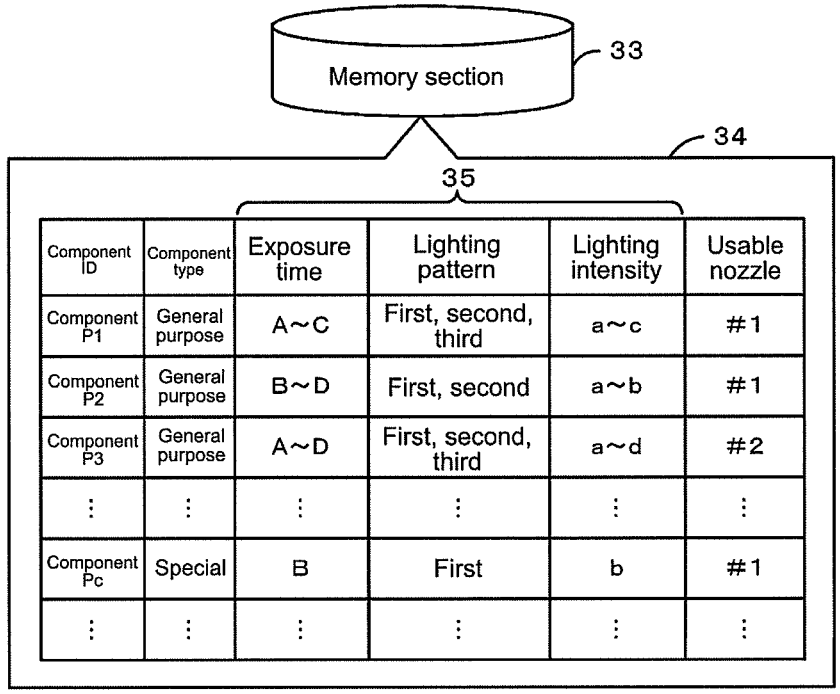

The present embodiment will be described below with reference to the drawings. FIG. 1 is a schematic illustration of mounting system 10 that is an example of the present disclosure. FIG. 2 illustrates an example of mounting unit 13 and imaging unit 15. FIG. 3 illustrates an example of mounting conditions information 19 stored in memory section 18. FIG. 4 illustrates an example of component database 34 stored in memory section 33. Mounting system 10, for example, is a system that performs mounting processing for mounting components on board S. Mounting system 10 is provided with mounting device 11 and management computer (PC) 30. Mounting system 10 is configured as a mounting line in which multiple mounting devices 11 for performing a mounting process for mounting components P on board S are arranged from upstream to downstream. For ease of understanding, FIG. 1 only shows one mounting device 11. In the present embodiment, left-right directions (X axis), front-rear directions (Y axis), and up-down directions (Z axis) are set as shown in FIGS. 1 and 2. Components P1 to P3, Pc (see FIG. 2) and the like are collectively referred to as component P.

As shown in FIG. 1, mounting device 11 includes board processing unit 12, mounting unit 13, component supply unit 14, imaging unit 15, and control unit 16. Board processing unit 12 loads board S, conveys board S, fixes board S at a mounting position, and unloads board S. Board processing unit 12 has a pair of conveyer belts at front and rear sides in FIG. 1 provided with a space in between and span board processing unit 12 in the left and right directions. Board S is conveyed by these conveyor belts.

Mounting unit 13 collects component P from component supply unit 14 and arranges it on board S fixed by board processing unit 12. Mounting unit 13 includes head moving section 20, mounting head 21 (collecting section), and suction nozzle 22. Head moving section 20 is provided with sliders that move in XY directions guided by guide rails and motors that drive the sliders. Mounting head 21 is removably attached to a slider and is movable in the XY directions by head moving section 20. One or more suction nozzles 22 are detachably mounted on the lower surface of mounting head 21 via holding section 21a. Holding sections 21a to 21c having different numbers of suction nozzles 22 mounted thereon are attached to mounting head 21 so as to be replaceable. In addition, any one of multiple types of suction nozzles 22 is mounted on the holding sections 21a to 21c. Multiple suction nozzles 22 (for example, eight or four) are mounted on holding portion 21a and holding portion 21b, such that multiple components P can be collected. Suction nozzle 22 collects a component using negative pressure, and is detachably mounted on mounting head 21. Components may be collected by mechanical chucks or the like for mechanically holding the component P in addition to suction nozzles 22.

Component supply unit 14 is provided with multiple reels, and is removably attached to a front side of mounting device 11. Tape is wound on each reel and multiple components P are held in the surface of the tape in a lengthwise direction. The tape is unwound to the rear from the reel, and with a component exposed, is fed by a feeder section to a pickup position at which the component is picked up by suction nozzle 22. Component supply unit 14 is provided with a tray unit that includes a tray on which components are loaded in multiple rows.

Imaging unit 15 (imaging section) is a device for capturing an image, and is a unit for imaging one or more components P picked up and held by mounting head 21. Imaging unit 15 is disposed between component supply unit 14 and board processing unit 12. The imaging range of imaging unit 15 is above imaging unit 15. Imaging unit 15 is provided with lighting unit 25, lighting control unit 26, imaging element 27, and image processing section 28. Lighting unit 25 is configured to emit light upward and in multiple lighting states with respect to component P held by mounting head 21. As shown in FIG. 2, lighting unit 25 includes, for example, first lamp 25a, second lamp 25b, and third lamp 25c arranged at upper, middle, and lower levels, and is a light source capable of adjusting the wavelengths of light shined on components P held by suction nozzles 22, brightness of light (lighting intensity), light positions (lighting patterns), and the like. Lighting unit 25 emits light from the side when first lamp 25a at the upper level is turned on (sidelighting), emits light from below when third lamp 25c at the lower level is turned on, and emits light from all origins when all the lamps are turned on (all on lighting). Lighting patterns of lighting unit 25 include those having different lighting directions, those having different light positions, and the like. Lighting control unit 26 controls lighting unit 25 based on predetermined imaging conditions so as to create lighting conditions corresponding to the component P collected by suction nozzle 22. Imaging element 27 emits an electric charge when receiving light, and outputs the electric charge. Imaging element 27 may be a CMOS image sensor capable of performing high-speed sequential capturing processing. Image processing section 28 performs processing to generate image data based on inputted electric charges. When mounting head 21 holding components P passes over imaging unit 15, imaging unit 15 captures one or more images, and outputs captured image data to control unit 16.

As shown in FIG. 1, control unit 16 is configured as a microprocessor centered around CPU 17, and includes memory section 18 for storing various data. Control unit 16 outputs control signals to board processing unit 12, mounting unit 13, component supply unit 14, and imaging unit 15, and receives signals from mounting unit 13, component supply unit 14, and imaging unit 15. Memory section 18 stores mounting conditions information 19 including mounting order information for mounting components P on board S, imaging conditions of components P, and the like. As shown in FIG. 3, mounting conditions information 19 includes information such as an arrangement order when mounting components P, identification information (IDs) of components P, component types, exposure times suitable for imaging components P, lighting patterns, lighting intensities, and types (usable nozzles) of the holding sections and suction nozzles 22 for collecting components P. Mounting conditions information 19 also includes information on the sizes of components P and the arrangement positions of components P (not shown).

Management PC 30 manages information of each device of mounting system 10. As shown in FIG. 1, management PC 30 includes control section 31, memory section 33, display 38, and input device 39. Control unit 31 is configured as a microprocessor centered on CPU 32. Memory section 33 is a device such as an HDD for storing various data such as a processing program. Display 38 is a liquid crystal screen for displaying various information. Input device 39 includes a keyboard, a mouse, and the like through which an operator inputs various commands. Memory section 33 stores component database 34 that includes information of components P. As shown in FIG. 4, component database 34 includes information such as component IDs, types of components, imaging conditions 35 used when imaging the component, information on usable nozzles capable of collecting the component, and the like. Component database 34 is a collection of component data used in the mounting process. The types of components P include, for example, general-purpose components (components P1 to P2) which are generally used for boards S such as rectangular passive components and transistors, and special components (components Pc) which are components (insulating material, a connector of a noise-proof shield custom-made product, or the like) having a shape unique to each product type. Imaging conditions 35 includes a range of the exposure time, a range of the lighting pattern, a range of the lighting intensity, and the like. Imaging conditions 35 include a range defined by an upper limit value and a lower limit value of exposure time, one or more types of lighting patterns, a range defined by an upper limit value and a lower limit value of lighting intensity, and the like, which allow the component to be identified by imaging. In this manner, imaging conditions 35 are defined as a range including multiple values. In imaging conditions 35, the imaging conditions may be generically determined for general-purpose components, and may be specially determined for special components. In particular, since the range of imaging conditions of a special component is often limited, imaging conditions 35 of general-purpose component are defined by a range including at least multiple values. The range of imaging conditions 35 is empirically determined, for example, in a range that allows the component to be recognized in an image obtained by imaging the component. Imaging conditions 35 may include a range of the shutter speed and the like. Management PC 30 uses component database 34 to create mounting conditions information 19 including information on the positions to which and the order in which mounting device 11 arranges component Ps.

Figure 5:
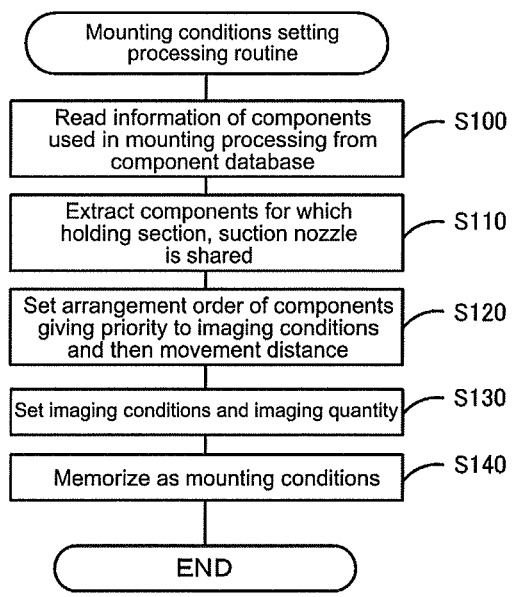
FIG. 5 is a flowchart showing an example of a mounting conditions setting processing routine.

Next, operation of mounting system 10 of the present embodiment configured as described above will be describe, starting with processing for setting the arrangement order of components P on board S. FIG. 5 is a flow chart showing an example of a processing routine for setting mounting conditions performed by CPU 32 of management PC 30. This routine is stored in memory section 33 and performed based on a setting start input by an operator. When this routine is started, CPU 32 first reads information of components P to be mounted on board S from component database 34 (S100). CPU 32 may identify components P from information (for example, CAD data) of the board S to be produced, and may extract this information. Next, the CPU 32 extracts a component group shared by the holding section or suction nozzle 22 (type of collecting sections) based on the read component information (S110). When the holding section and suction nozzle 22 are common, the process of exchanging them can be omitted in the mounting device 11, and the mounting processing time can be shortened.

Next, CPU 32 sets the arrangement order of components P giving priority to imaging conditions 35 so as to have the same range as much as possible, and then sets the arrangement order of components P giving priority to the movement distance so as to shorten the movement distance of mounting head 21 as much as possible. For example, with holding section 21a, because eight suction nozzles are attached, eight components P can be arranged by moving the mounting head 21 once (one pass). Here, if components P with different imaging conditions are mixed, imaging unit 15 has to perform imaging multiple times, and imaging takes a long time. In this mounting device 11, since imaging conditions 35 are defined as a range, even if there are multiple types of components P, the probability that imaging conditions 35 are shared is increased compared to when imaging conditions are defined for the components as an optimum value. Therefore, in mounting device 11, the quantity of times imaging is performed by imaging unit 15 can be reduced.

Next, CPU 32 sets imaging conditions and the imaging quantity when mounting head 21 moves back and forth (one pass) in order to arrange components P on board S (S130). FIG. 6 illustrates an example of setting imaging conditions. For example, it is assumed that components P with an arrangement order 1 to 8 shown in FIG. 6 are moved by holding section 21a in one pass. In this case, a common value is set for the imaging conditions among the ranges defined by the multiple components P held by mounting head 21. For example, the exposure time is B in the range of A to D, the lighting pattern is the first lamp 25a, the lighting intensity is b in the range of a to c, and the quantity of times imaging is performed is one. Then, CPU 32 stores the set arrangement order of components P, imaging conditions 35, the quantity of times imaging is performed, and the like in memory section 33 as mounting conditions information 19 (S140), and ends the routine. As described above, management PC 30 sets the arrangement order of components P1 to P3 and Pc for which imaging conditions 35 are defined in ranges including multiple values, based on one or more of the types of holding sections and suction nozzles 22, the movement distance of mounting head 21, and imaging conditions 35. Management PC 30 transmits mounting conditions information 19 to mounting device 11 prior to mounting device 11 starting mounting processing.

Figure 7:
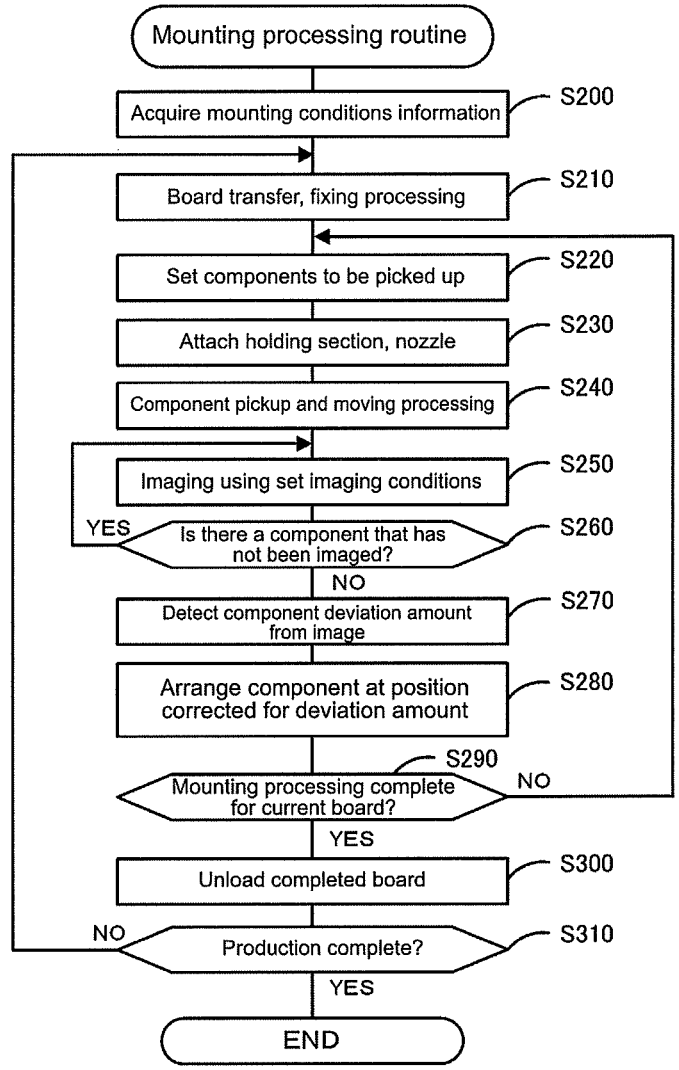
FIG. 7 is a flowchart showing an example of a mounting processing routine.

Next, mounting processing performed by mounting device 11 using mounting conditions information 19 will be described. FIG. 7 is a flow chart showing an example of a mounting processing routine performed by CPU 17 of mounting device 11. This routine is stored in memory section 18 and is executed based on a mounting start input from an operator. When this routine is started, CPU 17 first reads and acquires mounting conditions information 19 (S200), then causes board processing unit 12 to perform transfer and fixing processing of board S (S210). Next, CPU 17 sets components P to be picked up by suction nozzles 22 based on the arrangement order of mounting conditions information 19 (S220). Next, CPU 17 causes the holding section and suction nozzles 22 to be attached to mounting head 21 (S230) based on the set components P, and causes mounting unit 13 to perform pickup and moving processing of components P (S240). Here, CPU 17 moves mounting head 21 so as to pass over imaging unit 15.

Next, CPU 17 causes imaging unit 15 to perform imaging processing on the one or more components P held by mounting head 21 at predetermined timing (S250). Next, CPU 17 determines whether there is a component P held by mounting head 21 that has not been imaged based on the set quantity of times imaging is to be performed (S260). When there is a component P that has not been imaged, in S250, CPU 17 causes imaging unit 15 to image the component P while changing the exposure time and the lighting of lighting unit 25 in accordance with the imaging conditions. With mounting device 11, as described above, since imaging conditions 35 are defined in a range so as to make it likely that imaging conditions are common, the quantity of times imaging is performed can be reduced. On the other hand, when there is no component P that has not yet been imaged in S260, CPU 17 detects the amount of deviation in the pickup position of the component P from the imaged image (S270), and arranges the component P at the arrangement position on board S while correcting the amount of deviation (S280). CPU 17 may determine whether the component P is deformed or the like from the captured images.

Subsequently, CPU 17 determines whether mounting processing of the current board has been completed (S290), and if not completed, performs processing from S220 again. That is, CPU 17 sets the component P to be picked up next, exchanges the holding section and suction nozzle 22 as required, images the component P, corrects the deviation amount, and arranges the component P on board S. On the other hand, if mounting processing of the current board is complete, CPU 17 causes board processing unit 12 to unload the completed board S (S300), and determines whether production is complete (S310). If production is not complete, CPU 17 performs processing from S210 again, and if production is complete, the routine ends.

Next, correspondences between constituent elements of the present embodiment and constituent elements of the disclosure will be clarified. Mounting head 21 (holding section, suction nozzle 22) of the present embodiment corresponds to collecting section, imaging unit 15 corresponds to an imaging section, and control unit 16 corresponds to a control section. Components P1 to P3 correspond to a general-purpose component, and component Pc corresponds to a special component. Management PC 30 corresponds to a setting device, and control unit 31 corresponds to a setting section. In the present embodiment, an example of a mounting method is obvious from the descriptions of operation of mounting device 11, and an example of a setting method is obvious from the descriptions of operation of management PC 30.

With mounting device 11 of an embodiment described above, imaging conditions 35 are defined with respect to component P as a range including multiple values. Then, with mounting device 11, with mounting head 21 holding multiple components P that include imaging conditions 35 with a range that is not the same, imaging unit 15 images the multiple components P using imaging conditions with a shared value among the ranges defined for the multiple components P held by mounting head 21. Thus, with mounting device 11, since the imaging conditions are defined in a range, compared with a case in which the imaging conditions for the components are defined as a single optimum value, the possibility that imaging conditions share the same value when holding components P for which the imaging conditions are not in the same range increases. Therefore, with this device, components P can be imaged as few times as possible. Therefore, with this device, the production time of board S can be shortened.

Further, with mounting device 11, imaging conditions 35 include one or more of a range of exposure time, a range of shutter speed, a range of light pattern, and a range of lighting intensity. With this device, the production time can be shortened by using the exposure time, the shutter speed, the lighting pattern, the lighting intensity, and the like. Further, with mounting device 11, component P includes general-purpose components P1 to P3 and special components Pc, and imaging conditions of general-purpose components are defined to include at least multiple values. Generally, imaging conditions of special components are often determined individually, and are often within a specified narrow range. On the other hand, imaging conditions of general-purpose components can be relatively wide in many cases. With this device, since the possibility that imaging conditions of general-purpose components and imaging conditions of special components are shared increases by defining a range of imaging conditions for general-purpose component for which there is relatively high tolerance for the imaging conditions, component imaging is performed as few times as possible.

Management PC 30 (setting device) sets the arrangement order of components for which imaging conditions 35 are defined as a range including multiple values, based on one or more of the types of holding units 21a to 21c and suction nozzles 22, the movement distance of mounting head 21, and imaging conditions 35. In this manner, with management PC 30, since imaging conditions 35 are defined in a range, compared to a case in which imaging conditions are defined for components P as an optimum value, the possibility is increased that there will be a shared value when mounting device 11 is holding components for which imaging conditions 35 are not the same range. Therefore, the mounting device 11 can image components P as few times as possible. Therefore, with this device, production time for mounting device 11 can be shortened. In addition, management PC 30 sets the arrangement order of components P by giving priority to the types of collecting sections such as holding sections 21a to 21c and suction nozzles 22, by giving priority to imaging conditions 35 of components P, and by giving priority to the movement distance of mounting head 21. Therefore, for example, it is possible to reduce the frequency of exchanging of the collecting section and to further shorten the production time. Further, with this device, the production time can be further shortened by giving priority to the movement distance and the imaging conditions in order.

Meanwhile, it goes without saying that the disclosure is not limited to the above-mentioned embodiments and various embodiments may be applied within the technical scope of the disclosure.

For example, in an embodiment described above, imaging conditions 35 include one or more of the range of the exposure time, the range of the shutter speed, the range of the lighting pattern, and the range of the lighting intensity, however, one or more of these may be omitted. With this device too, components P are imaged as few times as possible, and the production time of board S is shortened.

In an embodiment described above, general-purpose components and special components are included, and imaging conditions of general-purpose components are defined in a range including at least multiple values; however, the present disclosure is not particularly limited thereto, and the imaging condition of the special component may be defined in a range, or a component other than a special component may be used.

In an embodiment described above, holding sections 21a to 21c are exchanged on mounting head 21, but so long as multiple components P can be held, holding sections 21a to 21c do not have to be exchangeable.

In an embodiment described above, management PC 30 sets the arrangement order of the component P using the type of the collecting section, the movement distance of the collecting section, and the imaging conditions, but the present disclosure is not particularly limited thereto, and any one or more of these may be omitted. Further, in an embodiment described above, settings are specified such that the arrangement order is set by prioritizing the type of the collecting section first, then imaging conditions 35, then the movement distance of component P, but the present disclosure is not particularly limited thereto, and the arrangement order of components may be set prioritizing any one of these. However, the arrangement order of components P is preferably set so that the production time is shorter.

In an embodiment described above, management PC 30 sets mounting conditions information 19, but the present disclosure is not particularly limited thereto, and mounting device 11 may set mounting conditions information 19.

Although the above-described embodiment has been described as mounting system 10 with mounting device 11 and management PC 30, it may be either mounting device 11 alone, management PC 30 alone, or may be implemented as a mounting method, or as a setting method.

In the mounting device of the present disclosure, the imaging conditions may include one or more of an exposure time range, a shutter speed range, a lighting pattern range, and a lighting intensity range. With this device, the production time can be shortened by using the exposure time, the shutter speed, the lighting pattern, the lighting intensity, and the like. Here, "lighting pattern" includes, for example, one having a different lighting direction, one having a different lighting positions, and the like.

With this mounting device, components may include general-purpose components for which imaging conditions are generically determined, and special components for which imaging conditions are specially determined, and the imaging conditions of the general-purpose components may be defined to include at least multiple values. Generally, imaging conditions of special components are often determined individually, and are often within a specified narrow range. On the other hand, imaging conditions of general-purpose components can be relatively wide in many cases. With this device, since the possibility that imaging conditions of general-purpose components and imaging conditions of special components are shared increases by defining a range of imaging conditions for general-purpose component for which there is relatively high tolerance for the imaging conditions, component imaging is performed as few times as possible.

A setting device of the present disclosure is used in a mounting system for mounting components including a collecting section configured to move a component for which imaging conditions are defined as a range including multiple values to an arrangement position in a state with multiple of the components collected, and an imaging section configured to image the multiple components held by the collecting section, the setting device including: a setting section configured to set an arrangement order of the components for which the imaging conditions are defined as a range including multiple values based on at least one of a type of the collecting section, a movement distance of the collecting section, and the imaging conditions.

With this setting device, the arrangement order of components for which imaging conditions are defined as a range including multiple values is set based on one or more of the type of the collecting section, the movement distance of the collecting section, and the imaging conditions. Thus, with this device, because the imaging conditions are defined as a range, compared to a case in which imaging conditions for the components are defined as an optimum value, the possibility that imaging conditions share the same value when holding components for which the imaging conditions do not have the same range increases, and the components can be imaged as few times as possible in the mounting device. Therefore, with this device, the production time of the mounting device is shortened.

With the setting device, imaging conditions may include one or more of an exposure time range, a shutter speed range, a lighting pattern range, and a lighting intensity range. Also, with the setting device, components may include general-purpose components for which imaging conditions are generically determined, and special components for which imaging conditions are specially determined, and imaging conditions of the general-purpose components may be defined to include at least multiple values.

With this setting device, the setting section may set an arrangement order of the components by prioritizing the type of the collecting section first, then the movement distance of the component, or may set an arrangement order of the components by prioritizing the type of the collecting section first, then the imaging conditions of the component. With this device, by prioritizing the type of the collecting section, for example, the frequency of exchanging the collection section can be reduced such that the production time is further shortened. Further, with this device, the production time can be further shortened by prioritizing the movement distance or the imaging conditions next.

A mounting system of this disclosure includes any of the mounting devices described above and any of the setting devices described above. In this system, the production time is shortened similar to with a mounting device and a setting device described above.

A mounting method of the present disclosure is performed by a mounting device including a collecting section configured to move a component for which multiple imaging conditions are defined as a range including multiple values to an arrangement position in a state with multiple of the components collected, and an imaging section configured to image the multiple components held by the collecting section, the mounting method including: when the collecting section is holding the multiple components that include imaging conditions with ranges that are not the same, causing the imaging section to image the multiple components using imaging conditions with a shared value among the ranges defined for the multiple components held by the collecting section.

With this mounting method, similar to with a mounting device described above, since components are imaged as few times as possible, it is possible to shorten the production time. Note that, with this mounting method, various aspects of the mounting device described above may be used, or a configuration for realizing each function of the mounting device described above may be added.

A setting method of the present disclosure is used in a mounting system for mounting components including a collecting section configured to move a component for which imaging conditions are defined as a range including multiple values to an arrangement position in a state with multiple of the components collected, and an imaging section configured to image the multiple components held by the collecting section, the setting method including: setting an arrangement order of the components for which the imaging conditions are defined as a range including multiple values based on at least one of a type of the collecting section, a movement distance of the collecting section, and the imaging conditions.

With this setting method, similar to with a setting device described above, since components are imaged as few times as possible in the mounting device, it is possible to shorten the production time. Note that, for this setting method, various aspects of the setting device described above may be used, or a configuration for realizing each function of the setting device described above may be added.

INDUSTRIAL APPLICABILITY

The mounting device and the setting device of the present disclosure may be applied to the technical field of devices that collect, arrange, and process components.

REFERENCE SIGNS LIST

10: mounting system;
11: mounting device;
12: board processing unit;
13: mounting unit;
14: component supply unit;
15: imaging unit;
16: control unit;
17: CPU;
18: memory section;
19: mounting conditions information,
20: head moving section;
21: mounting head;
21a to 21c: holding section;
22: suction nozzle;
25: lighting unit;
25a: first lamp;
25b: second lamp;
25c: third lamp;
26: lighting control unit;
27: imaging element;
28: image processing section;
30: management PC;
31: control section;
32: CPU;
33: memory section;

34: component database;
35: imaging conditions;
38: display;
39: input device;
P, P1 to P3, Pc: component;
S: board

The invention claimed is:

1. A mounting device comprising:
a collecting section configured to move a component for which imaging conditions are defined with a range including multiple values to an arrangement position in a state with multiple of the components collected;
an imaging section configured to image the multiple components held by the collecting section; and
a control section configured to, when the collecting section is holding the multiple components that include imaging conditions with ranges that are not the same, cause the imaging section to image the multiple components using imaging conditions with a shared value among the ranges defined for the multiple components held by the collecting section.

2. The mounting device according to claim 1, wherein the imaging conditions include one or more of an exposure time range, a shutter speed range, a lighting pattern range, and a lighting intensity range.

3. The mounting device according to claim 1, wherein the component includes a general-purpose component for which the imaging conditions are generically defined, and a special component for which the imaging conditions are specially defined, with the imaging conditions of the general-purpose component defined as a range including at least multiple values.

4. A setting device used in a mounting system for mounting components including a collecting section configured to move a component for which imaging conditions are defined as a range including multiple values to an arrangement position in a state with multiple of the components collected, and an imaging section configured to image the multiple components held by the collecting section, the setting device comprising:
a setting section configured to set an arrangement order of the components for which the imaging conditions are defined as a range including multiple values based on at least one of a type of the collecting section, a movement distance of the collecting section, and the imaging conditions.

5. The setting device according to claim 4, wherein the imaging condition include one or more of an exposure time range, a shutter speed range, a lighting pattern range, and a lighting intensity range.

6. The setting device according to claim 4, wherein the component includes a general-purpose component for which the imaging condition is generically defined, and a special component for which the imaging conditions are specially defined, with the imaging condition of the general-purpose component defined as a range including at least multiple values.

7. The setting device according to claim 4, wherein the setting section is configured to set the arrangement order of the components giving priority first to the type of the collecting section and then to the movement distance of the component, or to set the arrangement order of the components giving priority first to the type of the collecting section and then to the imaging condition of the components.

8. A mounting system comprising:
the mounting device according to claim 1; and
a setting device including a collecting section configured to move a component for which imaging conditions are defined as a range including multiple values to an arrangement position in a state with multiple of the components collected, and an imaging section configured to image the multiple components held by the collecting section, the setting device comprising:
a setting section configured to set an arrangement order of the components for which the imaging conditions are defined as a range including multiple values based on at least one of a type of the collecting section, a movement distance of the collecting section, and the imaging conditions.

9. A mounting system comprising the setting device according to claim 4.

10. A mounting method performed by a mounting device including a collecting section configured to move a component for which imaging conditions are defined as a range including multiple values to an arrangement position in a state with multiple of the components collected, and an imaging section configured to image the multiple components held by the collecting section, the mounting method comprising:
when the collecting section is holding the multiple components that include imaging conditions with ranges that are not the same, causing the imaging section to image the multiple components using imaging conditions with a shared value among the ranges defined for the multiple components held by the collecting section.

11. A setting method used in a mounting system for mounting components including a collecting section configured to move a component for which imaging conditions are defined as a range including multiple values to an arrangement position in a state with multiple of the components collected, and an imaging section configured to image the multiple components held by the collecting section, the setting method comprising:
setting an arrangement order of the components for which the imaging conditions are defined as a range including multiple values based on at least one of a type of the collecting section, a movement distance of the collecting section, and the imaging conditions.

* * * * *